United States Patent

Kaida

[11] Patent Number: 5,548,180
[45] Date of Patent: Aug. 20, 1996

[54] VIBRATOR RESONATOR AND RESONANCE COMPONENT UTILIZING WIDTH EXPANSION MODE

[75] Inventor: Hiroaki Kaida, Nagaokakyo, Japan

[73] Assignee: Murata Manufacturing Co., Ltd., Japan

[21] Appl. No.: 524,052

[22] Filed: Sep. 6, 1995

Related U.S. Application Data

[63] Continuation of Ser. No. 227,607, Apr. 14, 1994, abandoned.

[30] Foreign Application Priority Data

| Apr. 14, 1993 | [JP] | Japan | 5-087473 |
| Sep. 28, 1993 | [JP] | Japan | 5-241747 |
| Oct. 21, 1993 | [JP] | Japan | 5-263769 |

[51] Int. Cl.$^6$ .................................................. H01L 41/08
[52] U.S. Cl. ........................... 310/367; 310/321; 310/348
[58] Field of Search ..................................... 310/321, 348, 310/367

[56] References Cited

U.S. PATENT DOCUMENTS

| 4,101,795 | 7/1978 | Fukumoto et al. | 310/336 |
| 4,454,444 | 6/1984 | Fujiwara et al. | 310/348 |
| 4,462,092 | 7/1984 | Kawabuchi et al. | 367/105 |
| 5,117,147 | 5/1992 | Yoshida | 310/320 |
| 5,118,980 | 6/1992 | Takahashi | 310/320 |

FOREIGN PATENT DOCUMENTS

| 2939844 | 7/1980 | Germany | H03H 9/19 |
| 3220032 | 12/1982 | Germany | H03H 9/05 |
| 0137113 | 7/1985 | Japan | 310/348 |

OTHER PUBLICATIONS

J. Ormondroyd & J. P. Hartog, "The Theory of the Dynamic Vibration Absorber" pp. 9–22, Transactions of the American Society of Mechanical Engineers, APM-50-7.
UK Search Report dated Jun. 15, 1994.

Primary Examiner—Thomas M. Dougherty
Attorney, Agent, or Firm—Ostrolenk, Faber, Gerb & Soffen, LLP

[57] ABSTRACT

Disclosed herein is a piezoelectric resonator (11) utilizing a width expansion mode provided with a piezoelectric resonance part (12) having a rectangular section in which a ratio b/a of the length of each longer side to that of each shorter side is within a range of ±10% about the following value:

$$b/a = n(-1.47\sigma + 1.88) \qquad (1)$$

where a represents the length of each shorter side, b represents that of each longer side, σ represents a Poisson's ratio and n represents an integer, and support members (16, 17) which are coupled to central portions of both shorter sides of the piezoelectric resonance part.

20 Claims, 17 Drawing Sheets

VIBRATOR RESONATOR AND RESONANCE COMPONENT UTILIZING WIDTH EXPANSION MODE

This is a Continuation of application Ser. No. 08/227,607 filed on Apr. 14, 1994 now abandoned.

BACKGROUND OF THE INVENTION

1. Field of the Invention

The present invention relates to a vibrator having a rectangular section, and a resonator, and more particularly, it relates to a vibrator, a resonator and a resonance component utilizing a width expansion mode.

2. Description of the Background Art

In general, piezoelectric resonators utilizing an expansion vibration mode and a contour shear vibration mode are employed in the frequency range of several 10 kHz to 2 MHz.

Whichever one of the aforementioned vibration modes is utilized, however, nodal points of vibration are located only on central points of major surfaces of the piezoelectric resonator and hence it is difficult to stably hold the piezoelectric resonator. The aforementioned piezoelectric resonator is held at the nodal points, which are located on the centers of its major surfaces, with spring terminals. However, the conventional piezoelectric resonator utilizing an expansion vibration mode or a contour shear vibration mode employs a plate type vibrator, and hence stress may concentrate at contact points between the piezoelectric resonator and the spring terminals to crack the piezoelectric resonator, when the piezoelectric resonator is held by such spring terminals.

Further, it is difficult to select a holding structure other than the aforementioned one employing the spring terminals as well as to miniaturize a component employing the piezoelectric resonator, since the nodal points of vibration are located at the centers of the major surfaces.

SUMMARY OF THE INVENTION

An object of the present invention is to provide a vibrator, a resonator and a resonance component suitably employed in a frequency range of several 100 kHz to 2 MHz or a wider frequency range, which can be simplified in support structure, hardly causes stress concentration, and has a high possibility of reducing its overall size.

In order to solve the aforementioned problem, the present invention provides a vibrator having a rectangular section, which is provided with a pair of shorter sides and a pair of longer sides. In this vibrator, a ratio b/a of the length of each longer side to that of each shorter side is within a range of ±10% about the following value:

$$b/a = n(-1.47\sigma + 1.88) \quad (1)$$

where a represents the length of each shorter side, b represents that of each longer side, σ represents the Poisson's ratio of a material forming the vibrator and n represents an integer.

According to a specific aspect of the present invention, provided is a resonator utilizing a width expansion mode, further comprising a support member which is coupled to a substantially central portion of at least one of the shorter edges, serving as nodal points, of the aforementioned vibrator having a rectangular section.

The vibrator and the resonator according to the present invention utilize a width expansion mode, as hereinabove described. As clearly understood from embodiments described later, the width expansion mode is one of vibration modes of a vibrator having a rectangular section, which is in a vibrating state between expansion mode vibration of a vibrator having a square section and width mode vibration of a vibrator having a rectangular section.

According to the specific aspect of the present invention, the support member is coupled to the central portion of at least one of the shorter sides, in consideration of the fact that the nodal points of vibration are present not only at centers of major surfaces of the vibrator having a rectangular section but the central portions of the shorter sides in the vibrator utilizing the aforementioned width expansion mode.

In the resonator utilizing a width expansion mode according to the present invention, it is possible to support the vibrator by simply fixing the support member to the central portion of at least one of the shorter sides of the vibrator or integrating the former with the latter, whereby the support structure can be simplified. Therefore, it is possible to reduce the overall size of the resonator as compared with the conventional piezoelectric resonator utilizing contour vibration, which has been commercialized to be used in the frequency range of 1 to 2 Hz.

Thus, it is possible to provide a resonator utilizing a width expansion mode, which has not been present in general, thereby providing a resonator for use in a frequency range, which has been unavailable in general, by devising the material for the vibrator. When the vibrator is made of piezoelectric ceramics, for example, it is possible to obtain an energy-trap piezoelectric resonator which is effective in the frequency range of 800 kHz to 2 MHz and a wider frequency range.

According to another specific aspect of the present invention, provided is a resonance component utilizing the aforementioned width expansion mode, comprising the resonator utilizing a width expansion mode in accordance with claim 1, case substrates which are pasted to upper and lower portions of the resonator for holding the same, and cavity forming means provided in the case substrates or between the case substrates and the resonator for ensuring spaces for allowing vibration of a vibrating part of the resonator.

Namely, the support structure is so simplified that it is possible to easily form an integral chip type resonance component by fixing the case substrates to the upper and lower portions of the aforementioned resonator utilizing a width expansion mode and providing the cavity forming means in the case substrates or between the case substrates and the resonators.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates relation between the Poisson's ratios and the ratios b/a;

DESCRIPTION OF THE PREFERRED EMBODIMENTS

Embodiments of the present invention are now described with reference to the drawings, to clarify the present invention.

Figure 2:
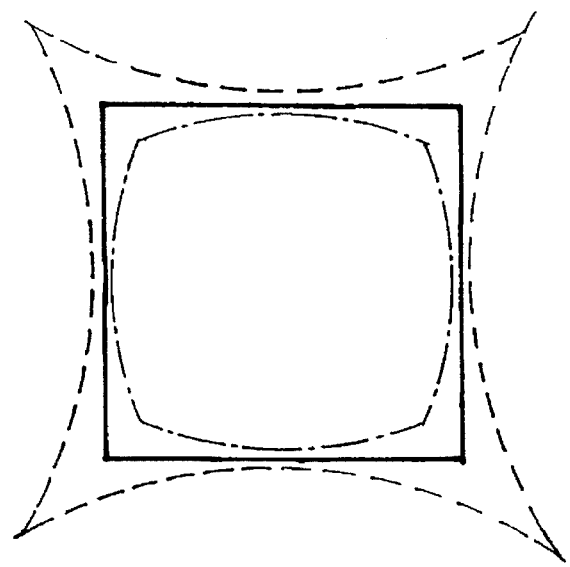
FIG. 2 is a schematic plan view for illustrating an expansion mode.
Figure 3:
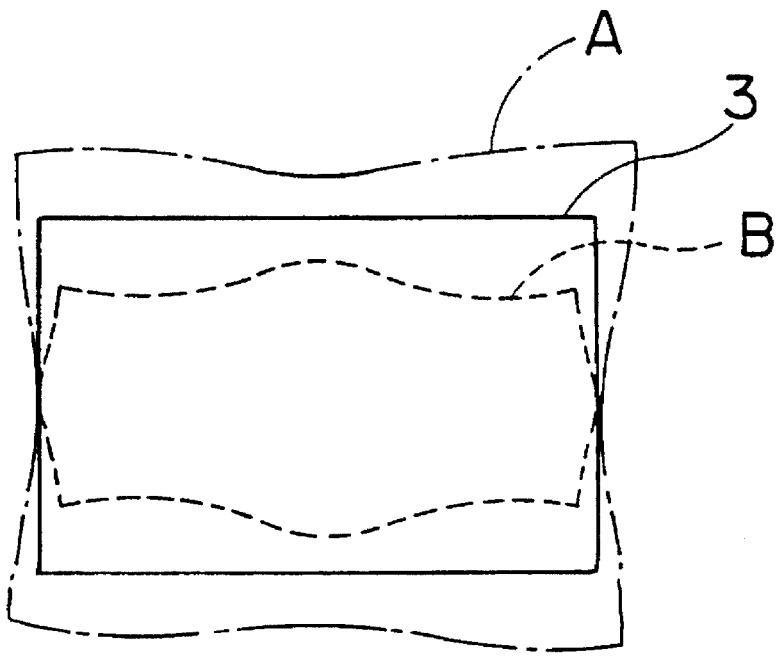
FIG. 3 is a schematic plan view for illustrating a width expansion mode.
Figure 4:
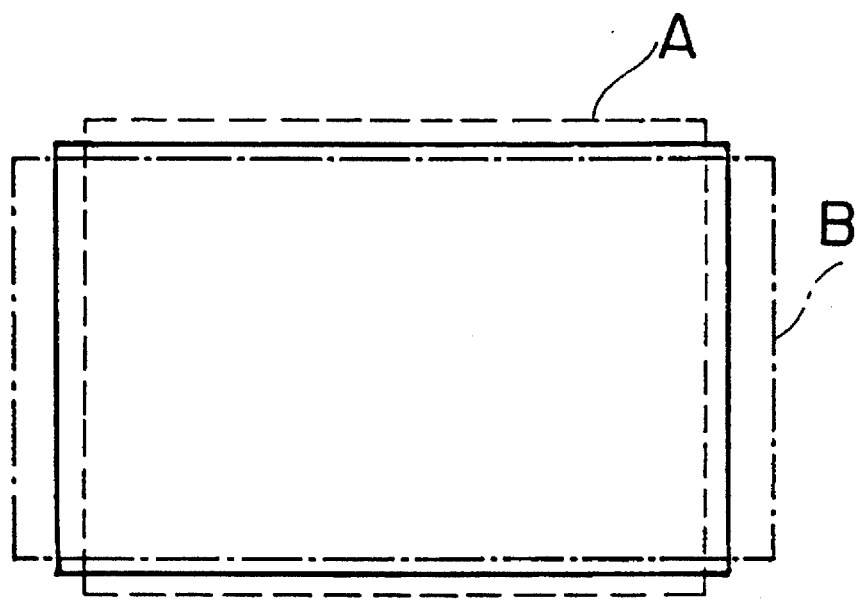
FIG. 4 is a schematic plan view for illustrating a width mode.

FIGS. 2 to 4 are schematic plan views showing vibrating states of vibrators, for illustrating an expansion mode, a width expansion mode and a width mode respectively. The inventor has analyzed vibrating states of rectangular plate type vibrators as vibrators having rectangular sections by a finite element method while varying lengths of shorter and longer sides. When the length b of each longer side is at a ratio b/a of 1 to the length a of each shorter side, i.e., when a vibrator 1 is in the form of a square, vibration of an expansion vibration mode is strongly excited as shown in FIG. 2. In other words, vibration is repeated in a state shown by broken lines A and that shown by one-dot chain lines B in the vibrator 1 having a square plane shape shown in FIG. 2, and expansion mode vibration is strongly excited.

On the other hand, it has been confirmed that a rectangular vibrator 2 vibrates between a state shown by broken lines A and that shown by one-dot chain lines B as shown in FIG. 4 and width mode vibration is strongly excited when the ratio b/a is considerably larger than 1, i.e., when b/a>>1.

Further, it has been recognized that width expansion mode vibration shown in FIG. 5 is strongly excited when the ratio b/a is larger than 1 and smaller than the aforementioned one strongly exciting width mode vibration.

Referring to FIG. 5, it has been recognized that vibration between states shown by one-dot chain lines A and broken lines B is strongly excited in a vibrator 3 having a rectangular sectional shape by selection of the aforementioned ratio b/a.

Figure 1:
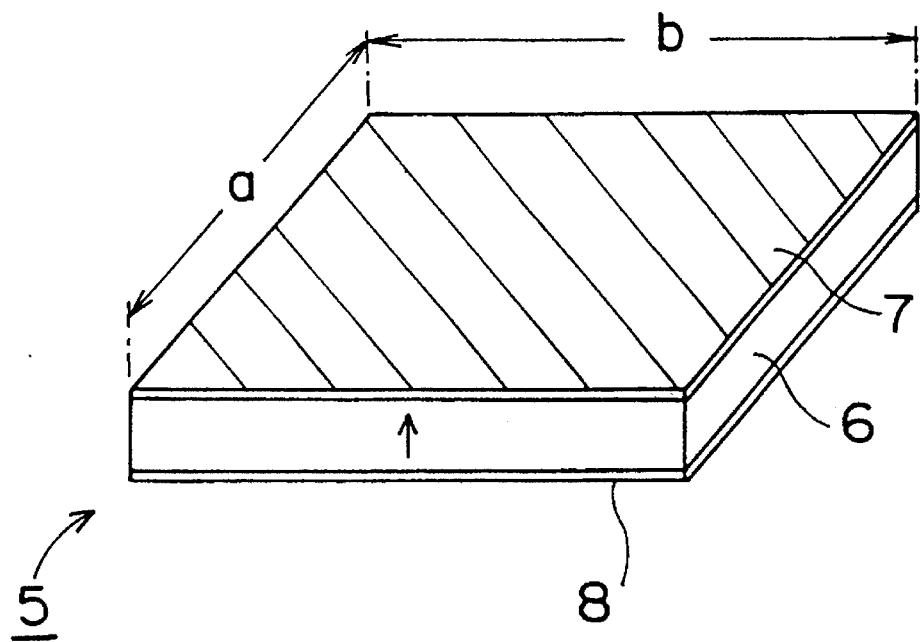
FIG. 1 is a perspective view for illustrating a vibrator employed in a first embodiment of the present invention.

The aforementioned vibration mode has been named as the width expansion mode since the same is conceivably a vibration mode between the well-known expansion and width modes. On the basis of the aforementioned recognition, the inventor has prepared a piezoelectric resonator with a piezoelectric diaphragm while selecting the ratio b/a at a specific value. FIG. 1 shows a piezoelectric resonator 5 obtained in this manner. This piezoelectric resonator 5 comprises a piezoelectric ceramic plate 6 of a rectangular sectional shape with shorter sides and longer sides having lengths a and b respectively, and electrodes 7 and 8 which are formed on overall major surfaces of the piezoelectric ceramic plate 6. The piezoelectric ceramic plate 6 is uniformly polarized along its thickness, as shown by arrow P.

Figure 5A:
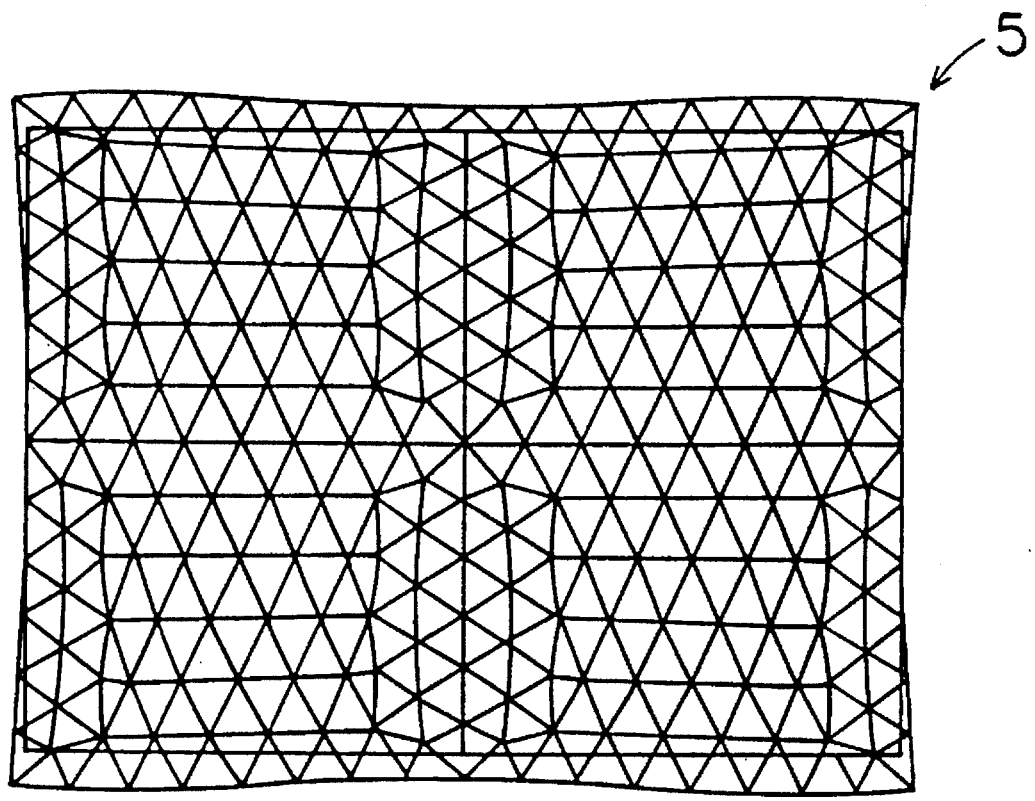
FIGS. 5A and 5B are a diagram showing displacement distribution in a width expansion mode analyzed by a finite element method and a diagram for illustrating coordinates in FIG. 5A respectively.

In the aforementioned piezoelectric resonator 5, the ratio b/a was varied to excite the aforementioned width expansion vibration mode, whereby it has been confirmed that the width expansion vibration mode was excited at the strongest when the equation $b/a=-1.47\sigma+1.88$ was satisfied. FIG. 5A shows displacement distribution in the piezoelectric resonator 5 in this case, which was analyzed by a finite element method.

Figure 5B:
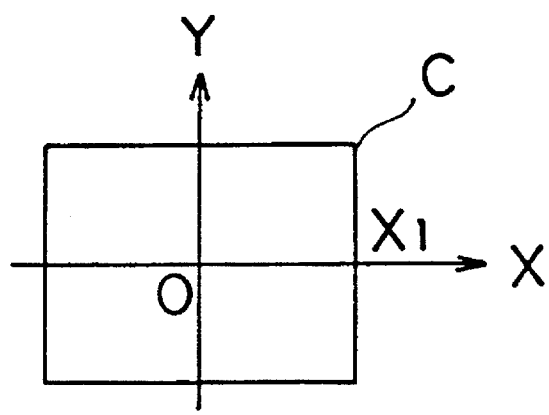
Figure 6:
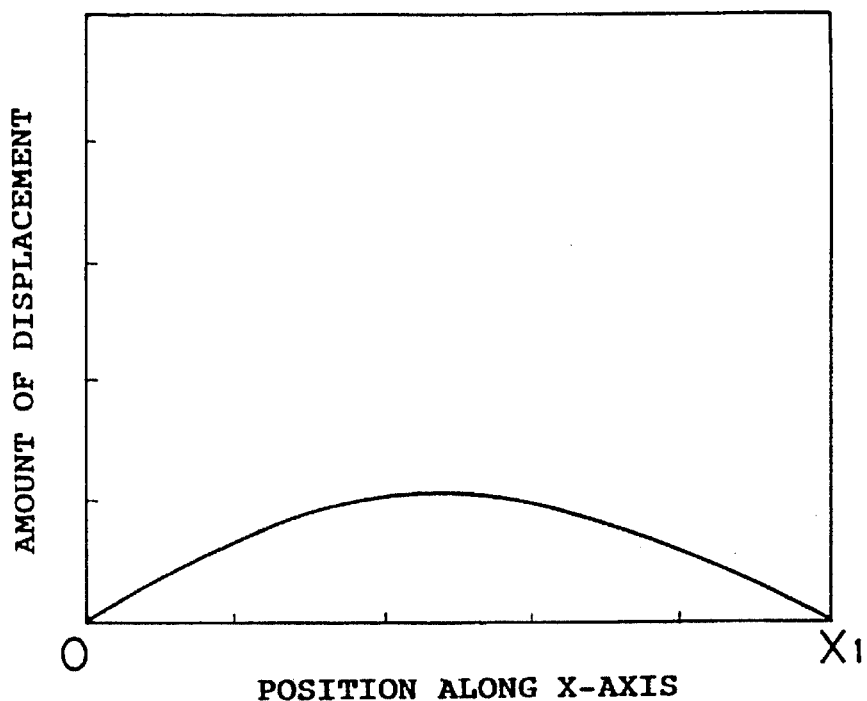
FIG. 6 illustrates relation between positions along a direction X and amounts of displacement in the displacement distribution shown in FIG. 5A.

In the aforementioned displacement distribution analyzed by a finite element method, states of displacement of respective parts were measured with the origin O set at the center of a major surface of the piezoelectric resonator 5 and the x- and y-axes defined as shown in FIG. 5B, whereby results shown in FIG. 6 were obtained. It is understood that the amounts of displacement were minimized at the center O and a point $X_1$ in FIG. 5B, i.e., the central portion of each shorter side, while the maximum amount of displacement was located at an intermediate position therebetween. This means that nodal points of vibration are positioned at the center of each major surface and the central portions of the shorter sides in the piezoelectric resonator 5 utilizing a width expansion mode. Thus, it is understood possible to support the piezoelectric resonator 5 without inhibiting the aforementioned width expansion mode by supporting the center of each major surface or the central portions of the shorter sides by other support members.

Figure 17A:
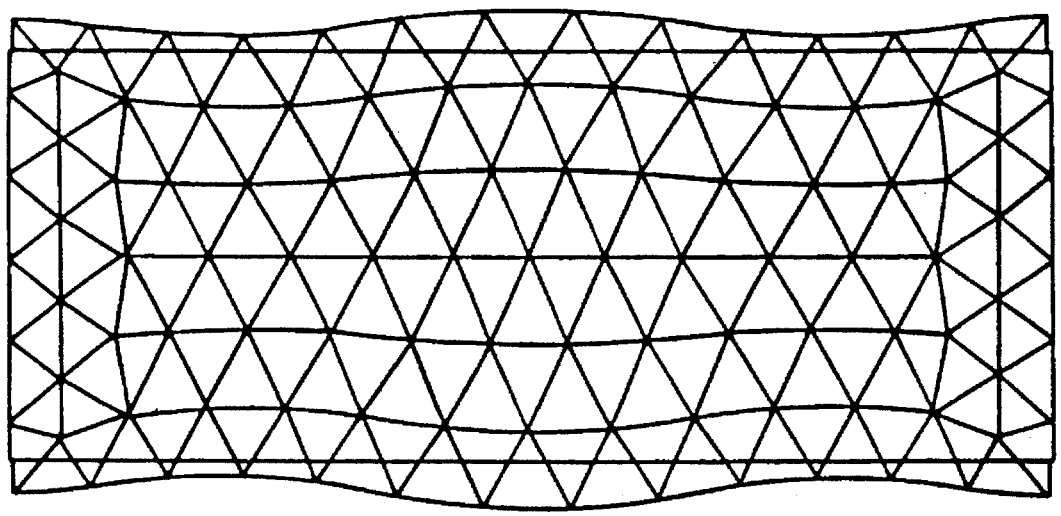
FIGS. 17A and 17B illustrate displacement distribution in a vibrator having a ratio expressed in the equation (1) with an integer n of 2 and that in a resonator formed by this vibrator.

It has also been confirmed that a similar width expansion mode is excited with nodal points located at the central portions of the shorter sides also when the aforementioned ratio b/a is integral times the value $-1.47\sigma+1.88$. This is now described with reference to FIGS. 17A and 17B. FIG. 17A illustrates displacement distribution in a vibrator having a ratio b/a expressed in the equation (1) with n=2, which was analyzed by a finite element method. It is understood from this figure that vibration of a width expansion mode is similarly excited also in this case.

Figure 17B:
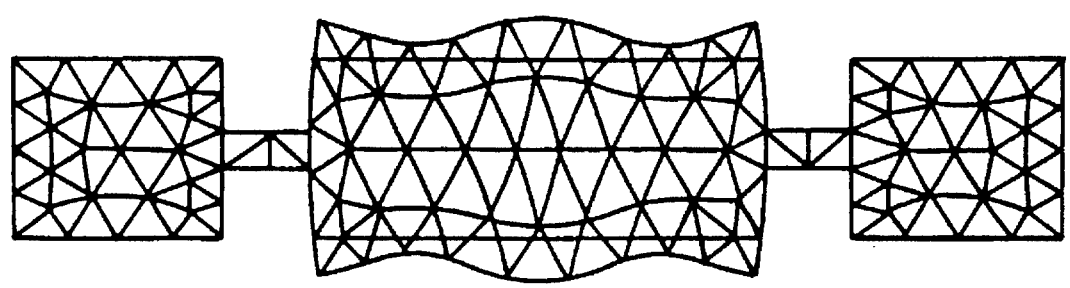

FIG. 17B illustrates displacement distribution in a resonator which comprises the vibrator having the ratio b/a with n=2, support members coupled to central portions of shorter sides thereof and holding parts provided outside the support members. It is clearly understood from FIG. 17B that the vibrator provided between the support members is excited in a width expansion mode and substantially no displacement is propagated toward the support members.

Figure 7:
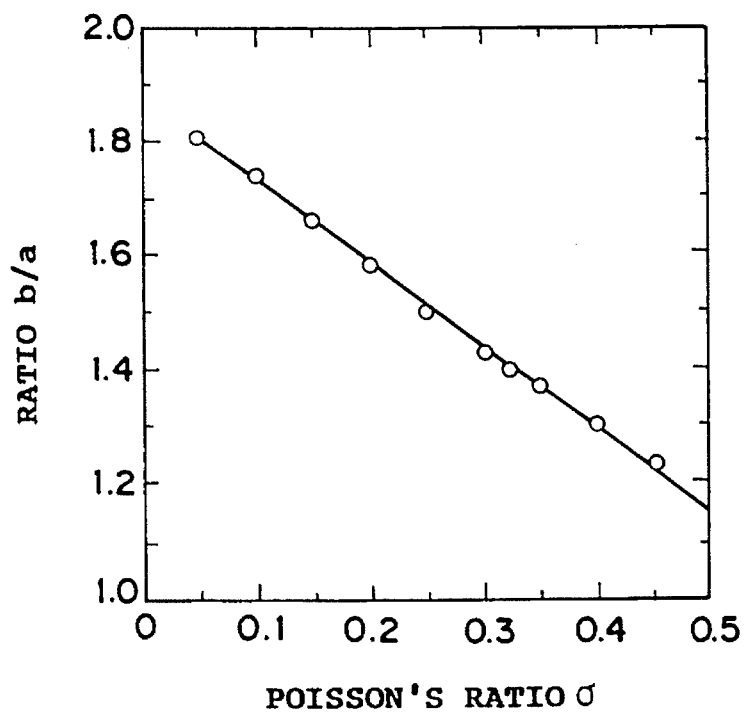
FIG. 7 illustrates relation between Poisson's ratios and dimensional ratios b/a for exciting width expansion mode vibration.

It has further been confirmed that the aforementioned ratio b/a is related to the Poisson's ratio of the piezoelectric resonator 5. The Poisson's ratio of the vibrator was varied to measure ratios b/a allowing excitation of the aforementioned width expansion vibration mode and the values b/a were plotted, to obtain results shown in FIG. 7. Thus, it has been recognized possible to reliably excite the width expansion vibration mode by selecting the ratio b/a to satisfy the following value:

$$b/a = n(-1.47\sigma+1.88) \qquad (2)$$

where n represents an integer, as shown in a straight line in FIG. 7.

Figure 8:
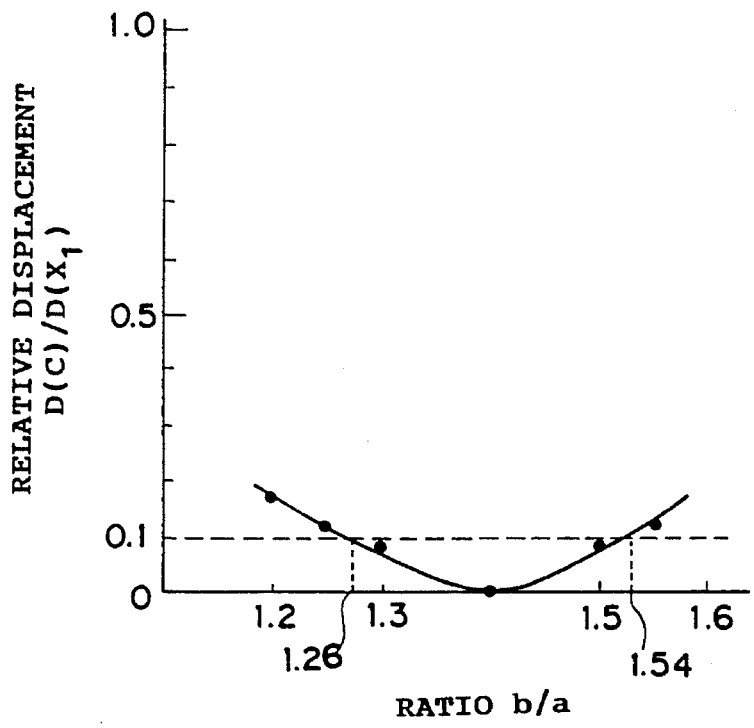
FIG. 8 illustrates relation between the ratios b/a and amounts of relative displacement in the displacement distribution shown in FIG. 5A.
Figure 9:
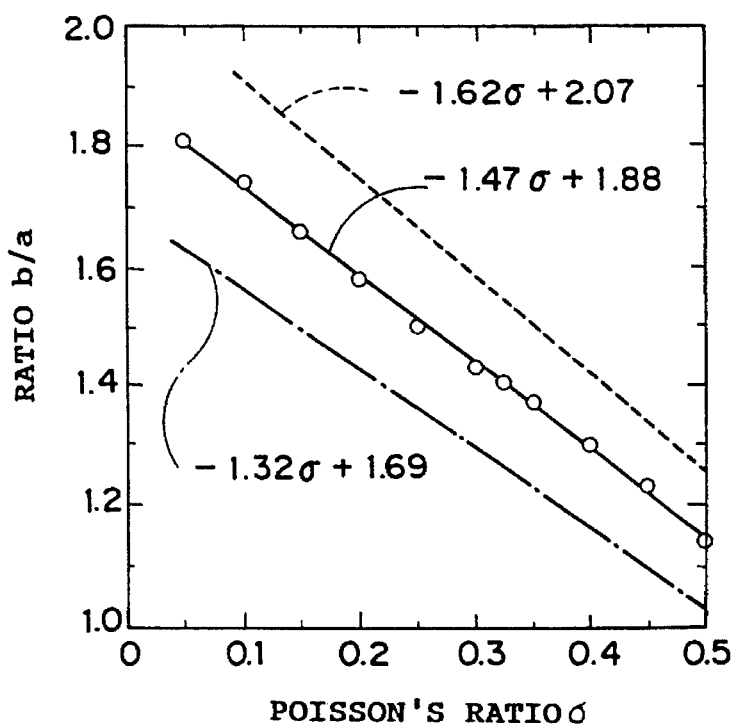

It has further been recognized that a width expansion vibration mode is strongly excited not only when the ratio b/a satisfies the equation (1) but also when the same slightly deviates from the equation (1). To this end, a piezoelectric ceramic plate having a Poisson's ratio $\sigma$ of 0.524 was employed and its ratio b/a was varied to confirm presence/absence of excitation of a width expansion vibration mode. Namely, relative displacement $D(X_1)/D(C)$ of the point $X_1$ in FIG. 5B with respect to a point C (see FIG. 5B), where the amount of displacement is maximized in the width expansion mode, was measured assuming that $D(X_1)$ represents the amount of displacement at the point $X_1$ and $D(C)$ represents the amount of displacement at the point C. FIG. 8 shows the results.

It is clearly understood from FIG. 8 that the relative displacement is within ±10% when the ratio b/a is in a range of 1.26 to 1.54 in relation to the Poisson's ratio $\sigma$ of 0.324. Then, a plurality of samples of the piezoelectric resonator 5 shown in FIG. 1 were prepared to have the ratios b/a within ±10% about the optimum value and support members were coupled to central portions of shorter sides thereof, to measure resonance characteristics. Consequently, it has been confirmed that width expansion mode vibration is effectively trapped when the relative displacement is within 10%, as described above.

Thus, it is understood possible to excite the aforementioned width expansion vibration mode in an excellent state by setting the aforementioned ratio b/a in the range of ±10% about a point satisfying the equation (1).

Figure 10A:
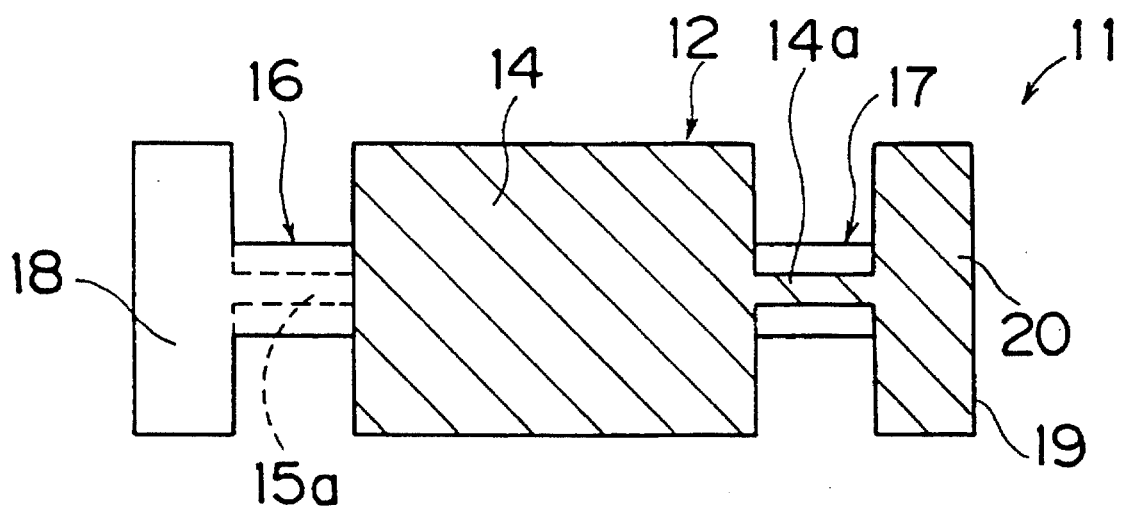
FIGS. 10A and 10B are a plan view and a front elevational view showing a piezoelectric resonator utilizing a width expansion vibration mode according to the first embodiment of the present invention.
Figure 10B:
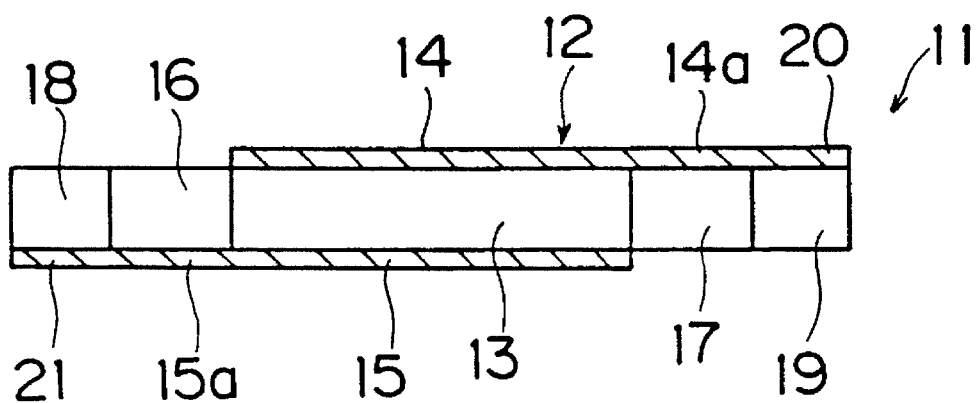
Figure 11:
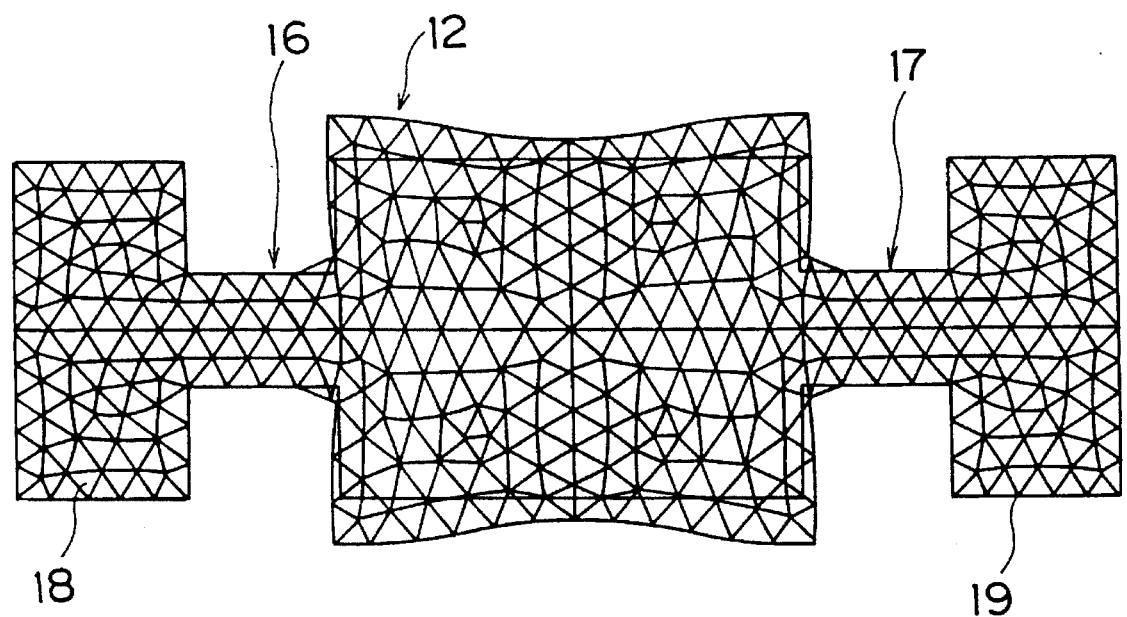
FIG. 11 illustrates displacement distribution in the piezoelectric resonator shown in FIGS. 10A and 10B.

FIGS. 10A and 10B are a plan view and a front elevational view showing a piezoelectric resonator 11 utilizing a width expansion mode according to the first embodiment of the present invention, which is prepared on the basis of the aforementioned recognition. The piezoelectric resonator 11 has a rectangular plate type piezoelectric resonance part 12 as a vibrator having a rectangular section. This piezoelectric resonance part 12 comprises a piezoelectric ceramic plate 13 having a rectangular section, which is uniformly polarized along its thickness, and resonance electrodes 14 and 15 which are formed on overall major surfaces of the piezoelectric ceramic plate 13 respectively. Support members 16 and 17 are coupled to central portions of shorter sides of the piezoelectric resonance part 12, which are nodal points of vibration excited in a width expansion mode, respectively. Further, holding parts 18 and 19 are coupled to outer ends of the support members 15 and 17 respectively.

According to this embodiment, the support members 16 and 17 and the holding parts 18 and 19 are integrally formed with the piezoelectric ceramic plate 13. Namely, a rectangular piezoelectric ceramic plate is machined to have the shape shown in FIGS. 10A and 10B. Alternatively, the support members 16 and 17 and the holding parts 18 and 19 may be formed independently of the piezoelectric resonance part 12, to be coupled with the same as shown in FIGS. 10A and 10B by a proper method such as adhesion.

The resonance electrodes 14 and 15 are electrically connected to terminal electrodes 20 and 21 which are formed on single major surfaces of the holding parts 18 and 19 through lead conductive parts 14a and 15a which are formed on single surfaces of the support members 16 and 17 respectively.

In the piezoelectric resonator 11 according to this embodiment, an alternating voltage is applied across the terminal electrodes 20 and 21, thereby exciting the piezoelectric resonance part 12 in a width expansion mode. In this case, the central portions of the shorter sides of the piezoelectric resonance part 12 hardly vibrate and form nodal points of the vibration, whereby the vibration of the width expansion mode is hardly inhibited by the support members 16 and 17. Thus, it is possible to effectively trap the vibration based on the aforementioned width expansion mode between the support members 16 and 17.

It has been recognized possible to form an energy-trap piezoelectric resonator which is suitably used in the frequency range of 800 kHz to 2 MHz according to this embodiment, since the piezoelectric resonance part 12 formed by a piezoelectric ceramic plate exhibits a resonance frequency of 800 kHz when the same is 2.5 mm in width and 3.5 mm in length and that of 2 MHz when the same is 1.0 mm in width and 1.4 mm in length.

When the piezoelectric resonance part 12 is made of another material, however, the effective frequency range is varied as to the aforementioned resonance frequency, as a matter of course. Thus, it is possible to obtain energy-trap piezoelectric resonators which are suitably used in various frequency ranges by preparing resonance parts 12 from various piezoelectric materials.

Figure 12:
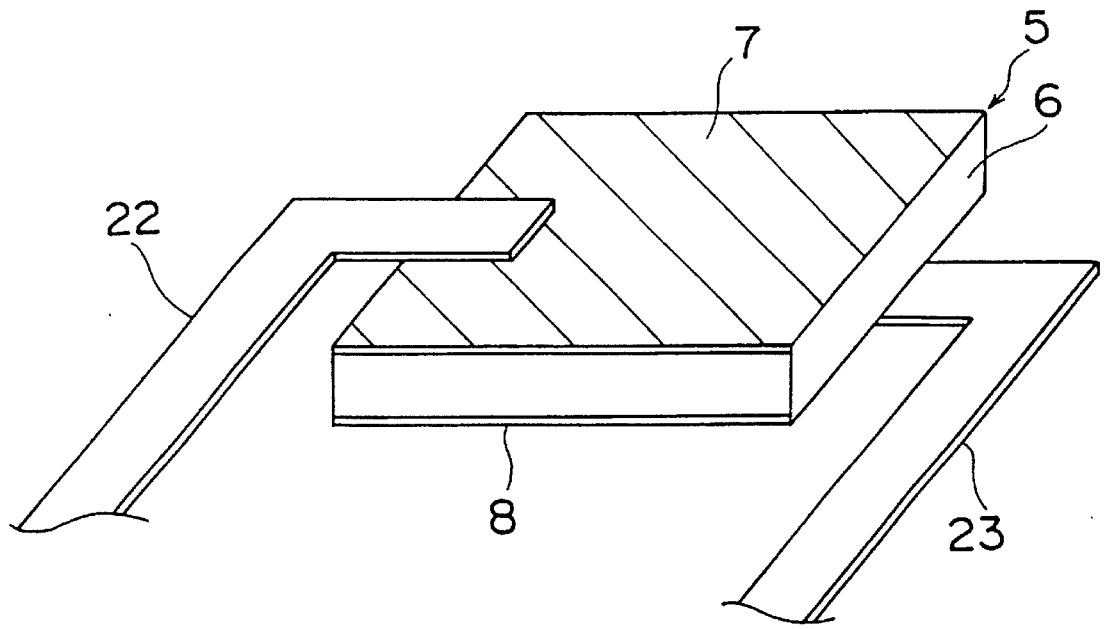
FIG. 12 is a perspective view showing a piezoelectric resonator utilizing a width expansion mode according to a second embodiment of the present invention.

FIG. 12 shows an energy-trap piezoelectric resonator 5 according to a second embodiment of the present invention. According to this embodiment, metal terminals 22 and 23 for serving as support members are bonded to electrodes 7 and 8, corresponding to those provided on both major surfaces of the piezoelectric resonator 5 shown in FIG. 1, by solder (not shown). In this case, the ratio b/a of the piezoelectric resonator 5 is so selected that width expansion mode vibration can be strongly excited as described above. In the piezoelectric resonator 5, therefore, central portions of shorter sides of its major surfaces form nodal points of vibration, and the metal terminals 22 and 23 are bonded to portions close to the nodal points by the solder. Also when the metal terminals 22 and 23 for serving as support members are bonded to the piezoelectric resonator 5 according to this embodiment as shown in FIG. 12, therefore, vibration of a width expansion mode excited in the piezoelectric resonator 5 is hardly inhibited.

Figure 13:
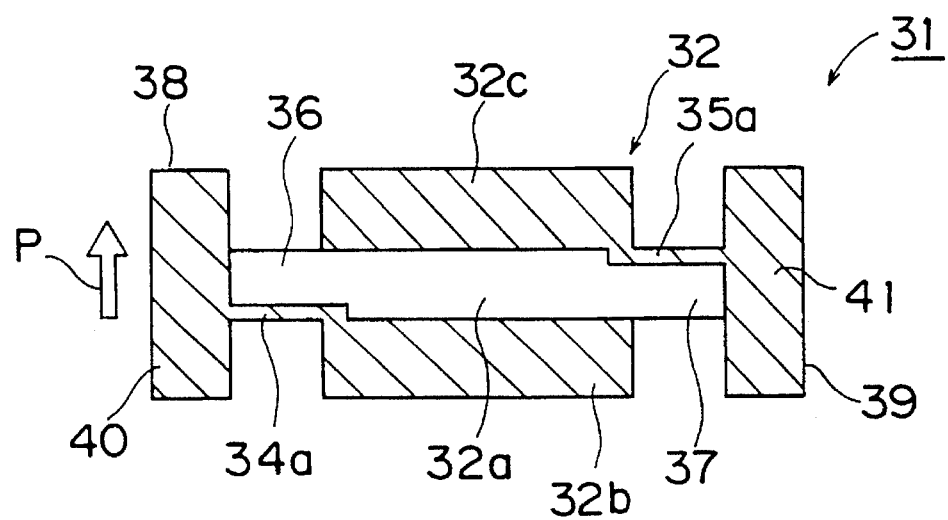
FIG. 13 is a plan view showing a piezo-resonator utilizing a width expansion mode according to a third embodiment of the present invention.

FIG. 13 shows an energy-trap piezoelectric resonator 31 according to a third embodiment of the present invention. This piezoelectric resonator 51 has a piezoelectric resonance part 32 as a vibrator having a rectangular section, similarly to the first embodiment. In this piezoelectric resonance part 32, a pair of resonance electrodes 32b and 32c are formed on an upper surface of a piezoelectric plate 32a along edges of its longer sides. The piezoelectric plate 32a is polarized along arrow P in FIG. 13, i.e., in a direction from the resonance electrode 32b toward the resonance electrode 32c. Also in this embodiment, the ratio b/a of the length b of each longer side of the piezoelectric resonance part 32 to the length a of each shorter side is set in the range within ±10% about a point satisfying the equation (1).

When an alternating voltage is applied across the resonance electrodes 32b and 32c, therefore, the piezoelectric resonance part 32 vibrates in a width expansion mode. In this case, the piezoelectric resonance part 32 is displaced in parallel with the electric field as applied, whereby the piezoelectric resonator 31 utilizes a piezoelectric longitudinal effect.

Also in the piezoelectric resonator 31 according to this embodiment, support members 36 and 37 are coupled to nodal points of vibration of the piezoelectric resonance part 32 resonating in the aforementioned width expansion mode, and holding parts 38 and 39 are coupled to outer ends of the support members 36 and 37 respectively. Referring to FIG. 13, numerals 34a and 35a denote lead conductive parts, and numerals 40 and 41 denote terminal electrodes.

As clearly understood from the embodiment shown in FIG. 13, the inventive resonator utilizing a width expansion mode is applicable not only to that utilizing a piezoelectric transverse effect, but to that utilizing a piezoelectric longitudinal effect.

While each of the above embodiments has been described with reference to a vibrator of a piezoelectric substance having a rectangular section, the present invention is characterized in that the ratio b/a of a vibrator having a rectangular section is selected in a specific range to excite the aforementioned width expansion mode vibration and support members are coupled to central portions of shorter sides in consideration of the fact that nodal points of the vibration of a width expansion mode are located at these central portions. Therefore, the vibrator as employed may alternatively be prepared from a material other than a piezoelectric substance.

Figure 14:
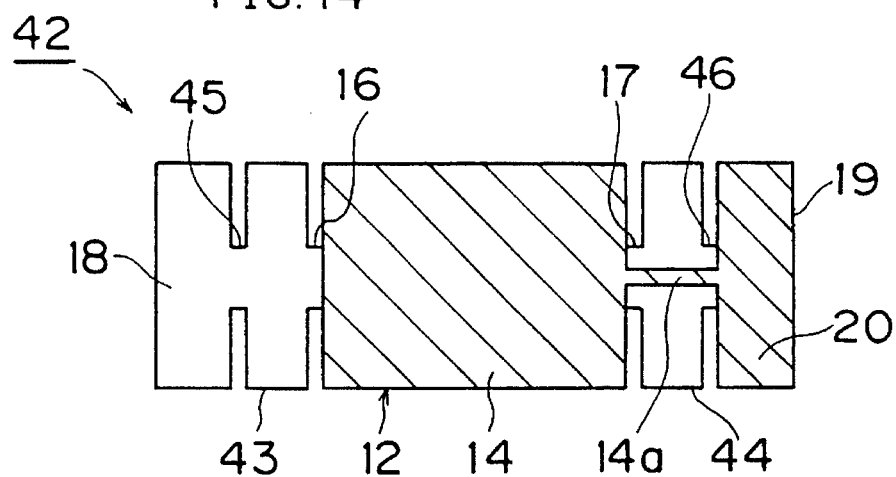
FIG. 14 is a plan view showing a piezoelectric resonator utilizing a width expansion mode, having dynamic dampers, according to a fourth embodiment of the present invention.

In the inventive resonator, further, dynamic dampers may be further provided outside the support members which are coupled to the vibrator, to cancel leaking vibration by a phenomenon of a dynamic damper. FIG. 14 shows such an embodiment.

FIG. 14 shows a piezoelectric resonator 42, which corresponds to a modification of the piezoelectric resonator 11 according to the first embodiment shown in FIGS. 10A and 10B. Portions corresponding to those shown in FIGS. 10A and 10B are denoted by corresponding reference numerals, to omit redundant description.

In this piezoelectric resonator 42, a pair of dynamic dampers 43 and 44 are provided on outer ends of support members 16 and 17 respectively, while coupling members 45 and 46 are coupled to central portions of outer side surfaces of the dynamic dampers 43 and 44 respectively and outer ends of the coupling members 45 and 46 are coupled to holding parts 18 and 19 respectively. Namely, the pair of dynamic dampers 43 and 44 and the coupling members 45 and 46 are inserted in a structure corresponding to that of the piezoelectric resonator 11 shown in FIGS. 10A and 10B. The dynamic dampers 43 and 44 are adapted to cancel leaking vibration by a well-known phenomenon of a dynamic damper. Namely, the dynamic dampers 43 and 44 receive leaking vibration and vibrate by the phenomenon of a dynamic damper, thereby canceling the vibration leaking from a resonance part 12.

Figure 15:
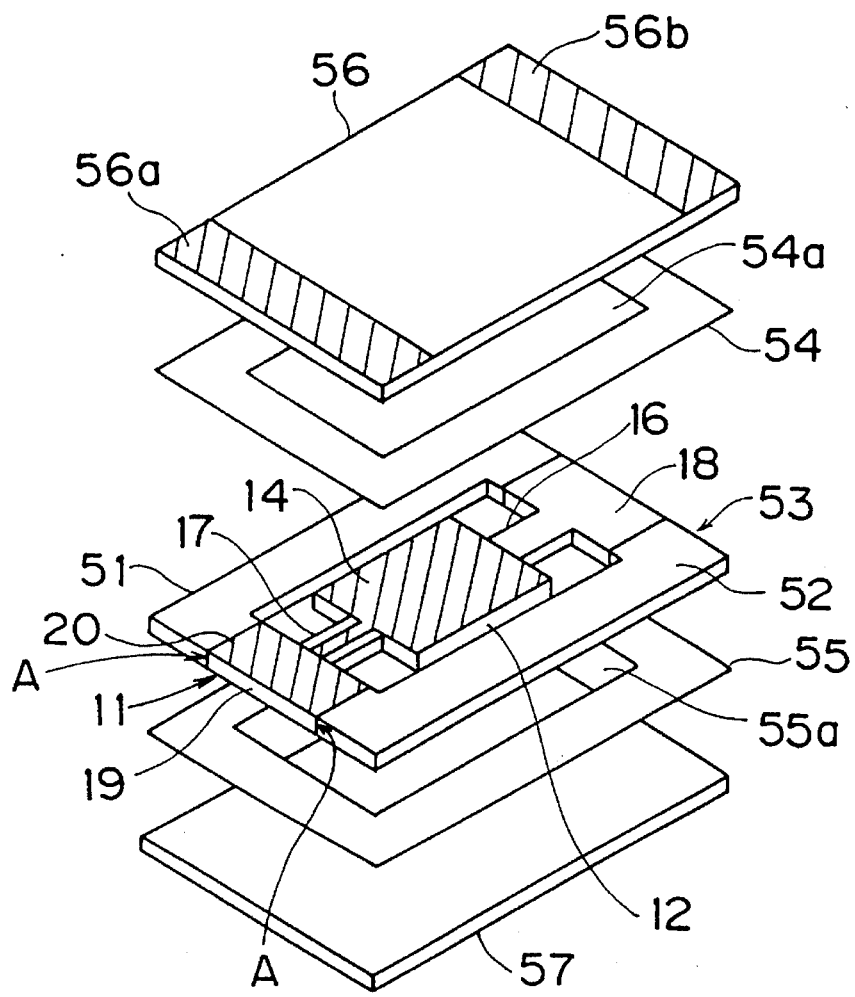
FIG. 15 is an exploded perspective view showing a chip-type resonance component according to a fifth embodiment of the present invention.
Figure 16:
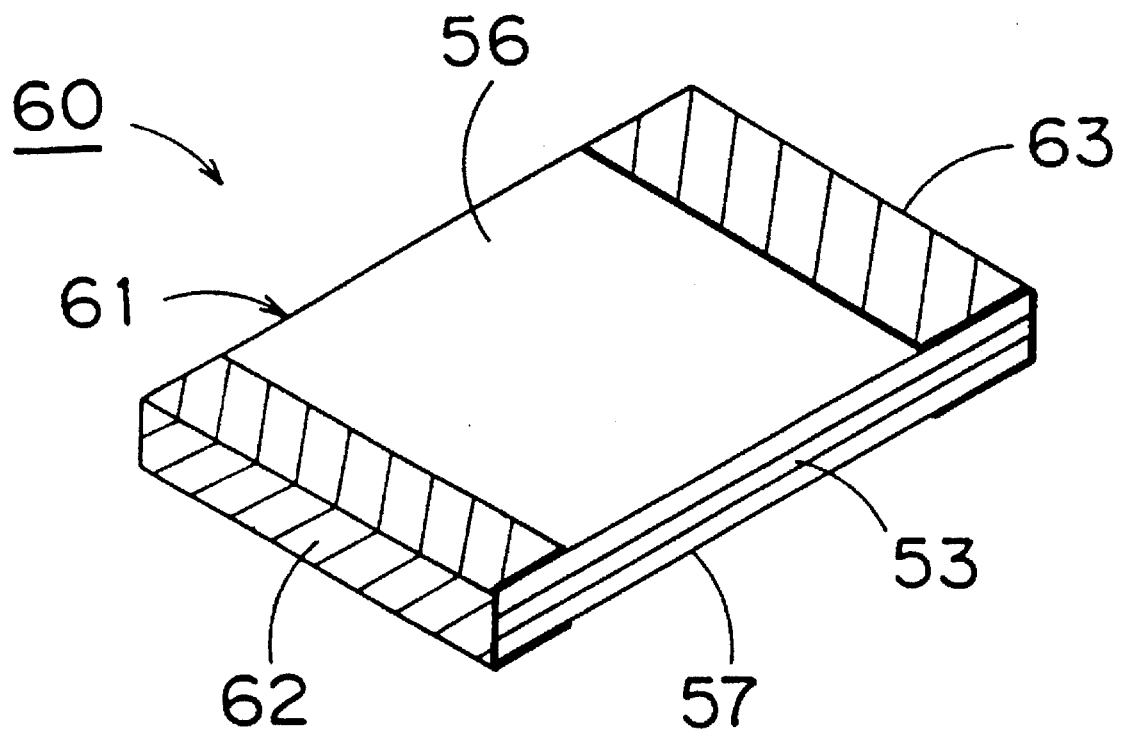
FIG. 16 is a perspective view showing the chip-type resonance component.

FIGS. 15 and 16 are an exploded perspective view and a perspective view for illustrating a chip-type resonance component according to a fifth embodiment of the present invention.

This embodiment is structured with employment of the piezoelectric resonator 11 utilizing a width expansion mode shown in FIGS. 10A and 10B. Namely, spacers 51 and 52 which are equivalent in thickness to the piezoelectric resonator 11 are bonded to side portions of the piezoelectric resonator 11, to form a resonance plate 53.

The spacers 51 and 52, which are substantially U-shaped in plane shape, are coupled to and integrated with holding parts 18 and 19 of the piezoelectric resonator 11 on both ends thereof.

These spacers 51 and 52 can be made of an arbitrary insulating material, such as insulating ceramics such as alumina or synthetic resin, for example.

Rectangular frame type cavity forming members 54 and 55 for serving as cavity forming means are arranged on upper and lower portions of the resonance plate 53, while case substrates 56 and 57 are pasted to the upper and lower portions of the resonance plate 53 with an insulating adhesive through the cavity forming members 54 and 55.

The cavity forming members 54 and 55 are adapted to allow vibration of a vibrating portion of the piezoelectric resonator 11, i.e., a piezoelectric resonance part 12. Therefore, sizes of openings 54a and 55a of the cavity forming members 54 and 55 and thicknesses of the cavity forming members 54 and 55 are selected in consideration of the aforementioned point.

The cavity forming members 54 and 55 can be made of insulating resin films such as polyethylene terephthalate films or sheet-type adhesive members, or other arbitrary insulating materials.

The case substrates 88 and 87 can be made of a proper synthetic material such as insulating ceramics such as alumina or synthetic resin. The case substrates 88 and 87 hold the resonance plate 53 through the cavity forming members 54 and 55 and are integrated with the same, to form a chip-type resonance component 60 shown in FIG. 16.

In this chip-type resonance component 60, external electrodes 62 and 63 are formed on both end surfaces of a laminate 61 which is formed by pasting the case substrates 56 and 57 to the resonance plate 53. The external electrodes 62 and 63 are formed by applying a conductive material by plating, vacuum deposition or sputtering.

The external electrodes 62 and 63 are preferably formed not only on both end surfaces of the laminate 61 but to reach upper and lower surfaces thereof as shown in FIG. 16, in order to facilitate electrical connection with a conductive pattern provided on a printed circuit board or the like, when the chip-type resonance component 60 is mounted on the printed circuit board. In order to facilitate such formation of the external electrodes 62 and 63 to reach the upper and lower surfaces of the laminate 61, electrodes 56a and 56b are previously formed on the case substrate 56 in this embodiment, as shown in FIG. 15. Another pair of electrodes (not shown) are also formed on a lower surface of the case substrate 57.

The electrodes 56a and 56b may not necessarily be previously formed as described above, but an external electrode material may be applied to end surfaces of the laminate 61 to reach the upper and lower surfaces after the laminate 61 is obtained, to form the electrodes 56a and 55b.

While the cavity forming members 54 and 55 are independently prepared in this embodiment, concave portions having plane shapes corresponding to those of the openings 54a and 55a of the cavity forming members 54 and 55 may be formed in the lower surface of the case substrate 56 and the upper surface of the case substrate 57 respectively, thereby forming cavities for allowing vibration of the vibrating portion of the piezoelectric resonator 11. In this case, it is possible to omit the cavity forming members 54 and 55 by adjusting the depths of the concave portions.

Alternatively, an insulating adhesive may be applied to the lower surface of the case substrate 56 and the upper surface of the case substrate 57 in the form of rectangular frames with adjustment of the thicknesses of the insulating adhesive layers as formed, to define cavities for allowing vibration of the resonance part 12 of the piezoelectric resonator 11, in place of the cavity forming members 54 and 55 and the aforementioned concave portions. In this case, the insulating adhesive layers for pasting the case substrates 56 and 57 to the resonance plate 53 also serve as the cavity forming means according to the present invention.

While the piezoelectric resonator 11 shown in FIGS. 10A and 10B is employed in the embodiment shown in FIGS. 15 and 16, the same may be replaced by another resonator utilizing a width expansion mode according to the invention described in claim 1 such as the piezoelectric resonator 31 shown in FIG. 13, for example, to easily form a chip-type resonance component similarly to the above.

In the aforementioned chip-type piezoelectric resonance component 60 shown in FIG. 16, the piezoelectric resonator 11 is bonded with the spacers 51 and 52 by an insulating adhesive (see FIG. 15). If defective bonding is caused in bonded portions shown by arrows A in FIG. 15, therefore, sealing performance is damaged. In other words, the portion of the piezoelectric resonator 11 provided with the resonance part 12 is deteriorated in sealing performance. In this case, characteristics such as moisture resistance are reduced in the chip-type piezoelectric resonance component 60.

Figure 18:
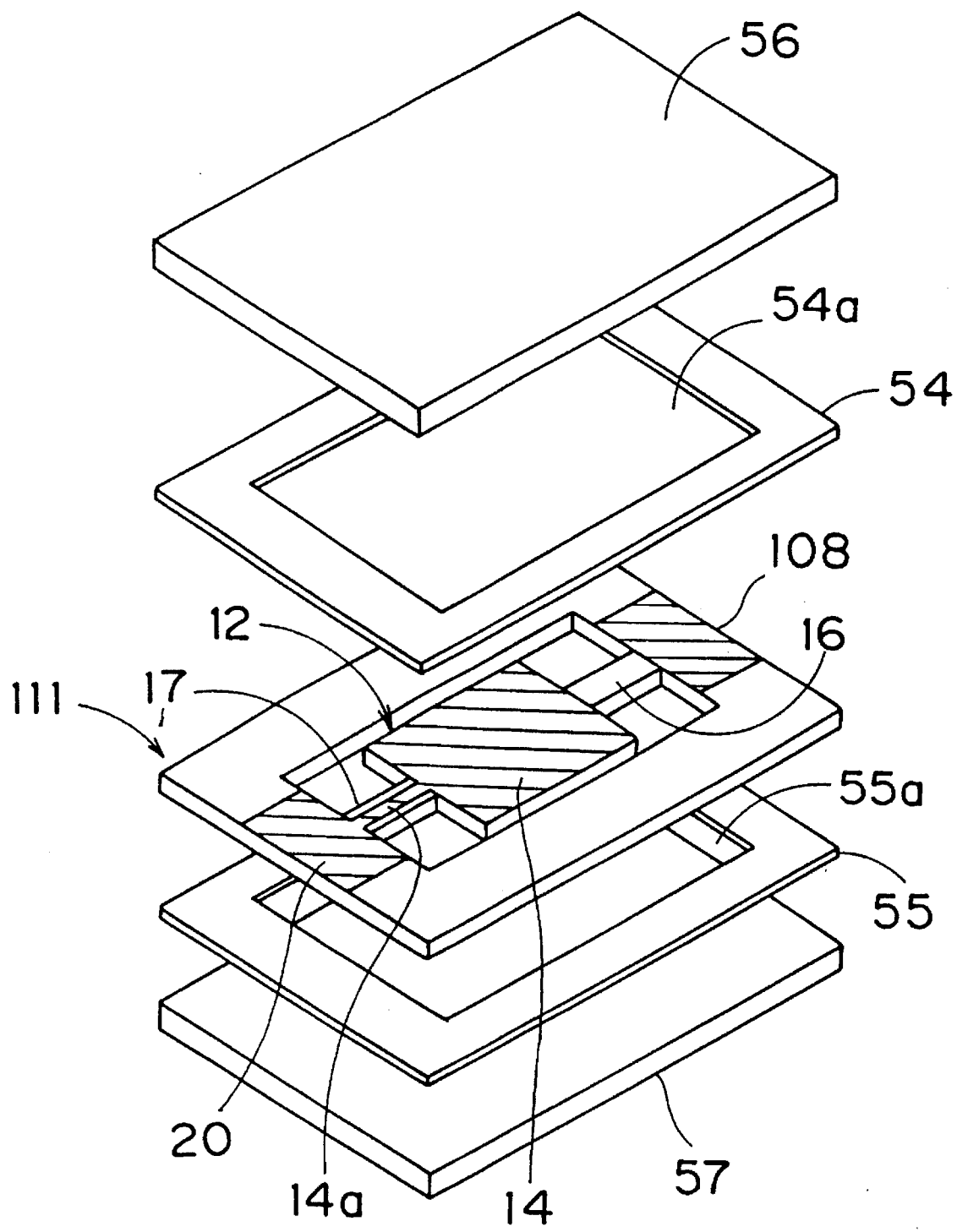
FIG. 18 is an exploded perspective view for illustrating a chip-type resonance component employing a piezoelectric resonator according to a sixth embodiment of the present invention.

An embodiment which can overcome the aforementioned problem of moisture resistance is now described with reference to FIGS. 18 to 21. FIG. 18 is an exploded perspective view corresponding to FIG. 15, for illustrating a chip-type piezoelectric resonance component according to a sixth embodiment of the present invention. In the chip-type piezoelectric resonance component shown in FIG. 18, a piezoelectric resonator 111 in the form of a rectangular frame is employed in place of the piezoelectric resonator 11 and the spacers 51 and 52 shown in FIG. 15. Other structures, i.e., cavity forming members 54 and 55 and protective substrates 56 and 57, are similar to those shown in FIG. 15, and hence redundant description is omitted.

Figure 19:
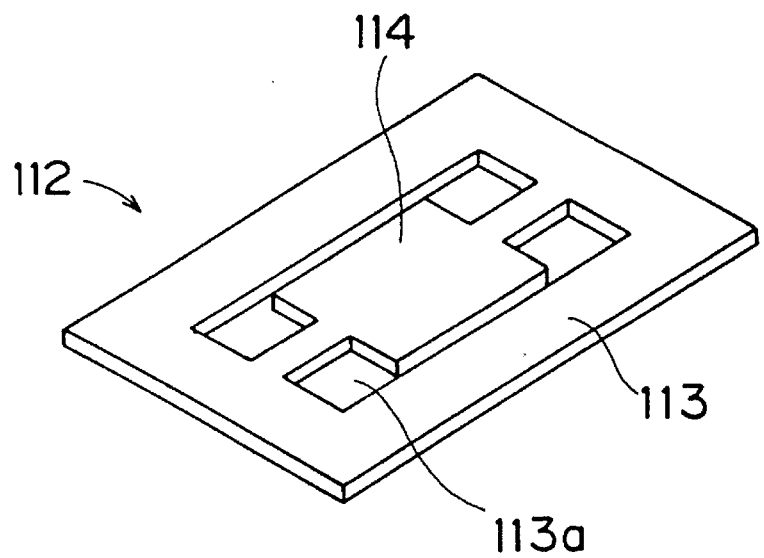
FIG. 19 is a perspective view showing a piezoelectric ceramic plate employed in the piezoelectric resonator shown in FIG. 18.

The piezoelectric resonator 111 is formed by a piezoelectric ceramic plate 112 shown in FIG. 19 in a perspective view. This piezoelectric ceramic plate 112 is obtained by working a single rectangular piezoelectric ceramic plate into the shape shown in FIG. 19 by etching with a laser beam or machining, for example. In this piezoelectric ceramic plate 112, a rectangular frame type support part 113 having an opening 113a and a piezoelectric ceramic plate part 114 forming a resonance part are integrated with each other. Electrodes are formed on this piezoelectric ceramic plate 112 similarly to the piezoelectric resonator 11, to obtain the piezoelectric resonator 111 shown in FIG. 20.

In other words, the piezoelectric resonator 111 corresponds to such a structure that the piezoelectric resonator 11 and the spacers 51 and 52 shown in FIG. 15 are integrated with each other. Therefore, the resonance part and the electrodes of the piezoelectric resonator 111 are denoted by the same reference numerals as those of the piezoelectric resonator 11, to omit redundant description.

The piezoelectric resonator 111 shown in FIG. 18 is formed by the aforementioned single piezoelectric ceramic plate 112. While the piezoelectric resonance component shown in FIG. 15 may be deteriorated in moisture resistance through the bonded portions shown by arrows A, the chip-type piezoelectric resonance component according to this embodiment is effectively improved in moisture resistance since no bonded portions are present on side portions of the resonance part.

Figure 21:
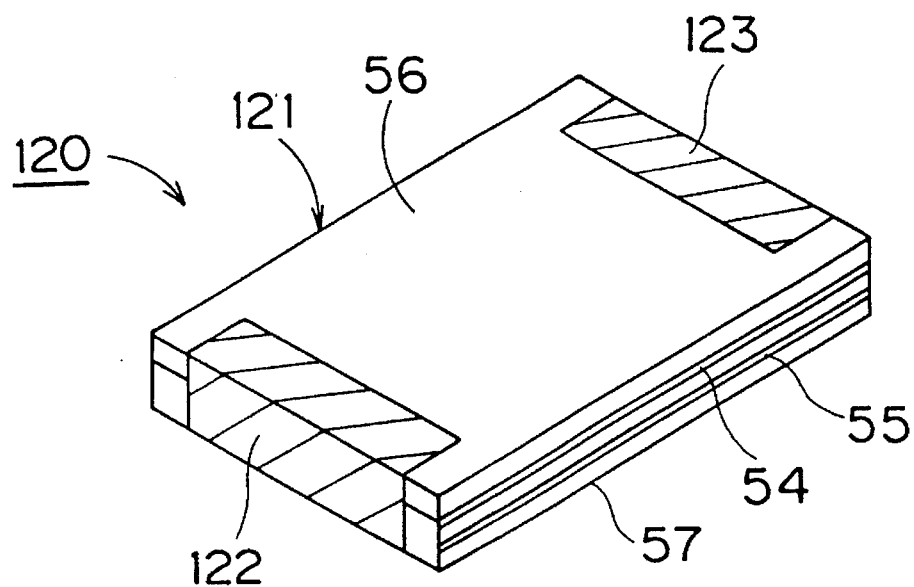
FIG. 21 is a perspective view showing the appearance of the chip-type piezoelectric resonance component shown in FIG. 18.

FIG. 21 is a perspective view showing a chip-type piezoelectric resonance component 120 which is obtained by stacking the piezoelectric resonator 111, the cavity forming members 54 and 55 and the protective substrates 56 and 57 shown in FIG. 18. In this chip-type piezoelectric resonance component 120, external electrodes 122 and 123 are formed to cover a pair of end surfaces of a laminate 121 which is obtained by pasting the aforementioned members to each other. Thus, the chip-type piezoelectric resonance component 120 can be surface-mounted on a printed circuit board or the like, similarly to other chip-type electronic components.

Figure 22:
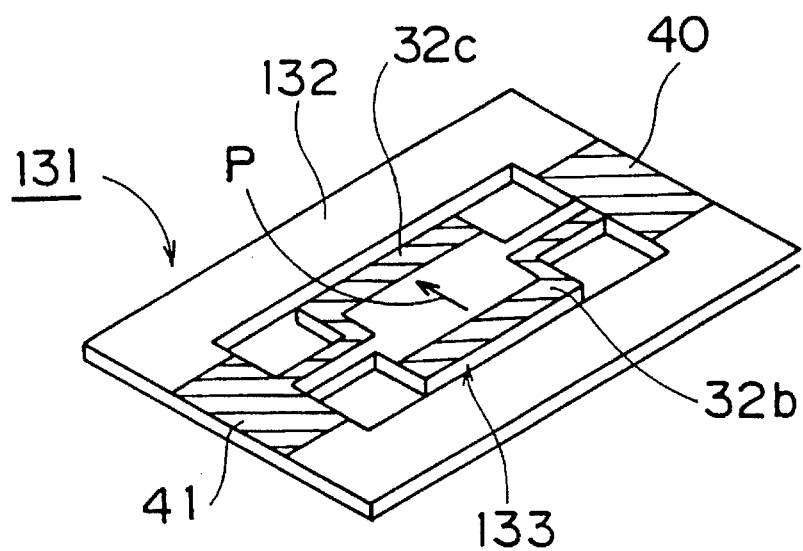
FIG. 22 is a perspective view showing a modification of the piezoelectric resonator, which is integrated with a rectangular frame type support member.

FIG. 22 illustrates a modification of the aforementioned piezoelectric resonator 11i. Referring to FIG. 22, a piezoelectric resonator 131 has a rectangular frame type support member 132, and a piezoelectric resonator part 133 which is integrally formed with the rectangular frame type support member 132. The piezoelectric resonator part 133 is formed similarly to the piezoelectric resonator 31 shown in FIG. 13. Therefore, parts such as a resonance part which are identical to those of the piezoelectric resonator 31 are denoted by the same reference numerals, to omit redundant description.

Figure 20:
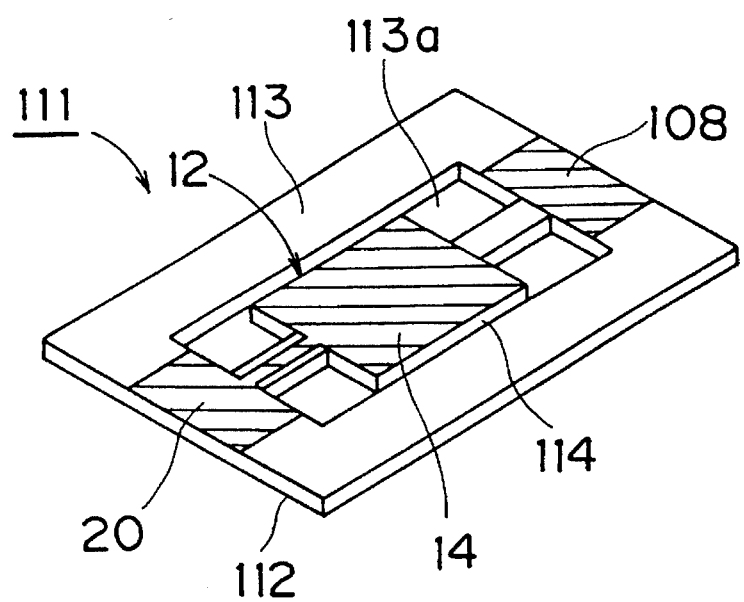
FIG. 20 is a perspective view showing the piezoelectric resonator.

Also in the piezoelectric resonator 131, it is possible to effectively improve moisture resistance of a chip-type piezoelectric resonance component formed by this piezoelectric resonator 131 similarly to the piezoelectric resonator 111 shown in FIGS. 18 and 20, since the rectangular frame type support member 132 is integrated with the piezoelectric resonator part 133.

Figure 23A:
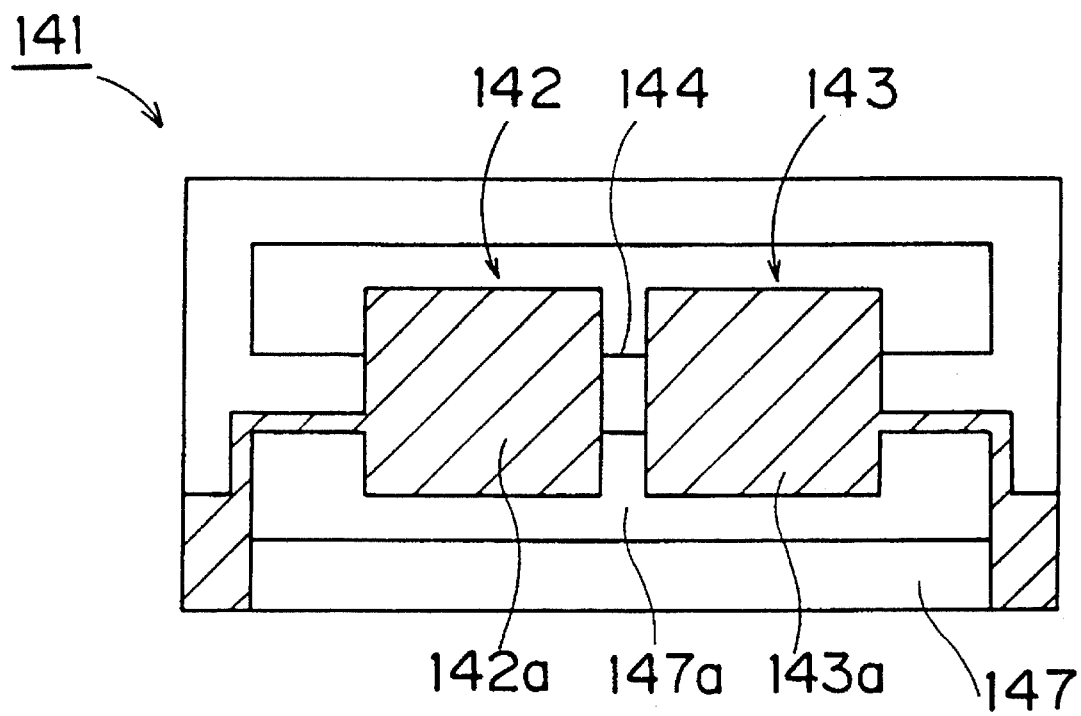
FIGS. 23A and 23B are a plan view showing a piezoelectric filter as a piezoelectric resonator according to a seventh embodiment of the present invention and a typical plan view showing shapes of lower electrodes through a piezoelectric ceramic plate.
Figure 23B:
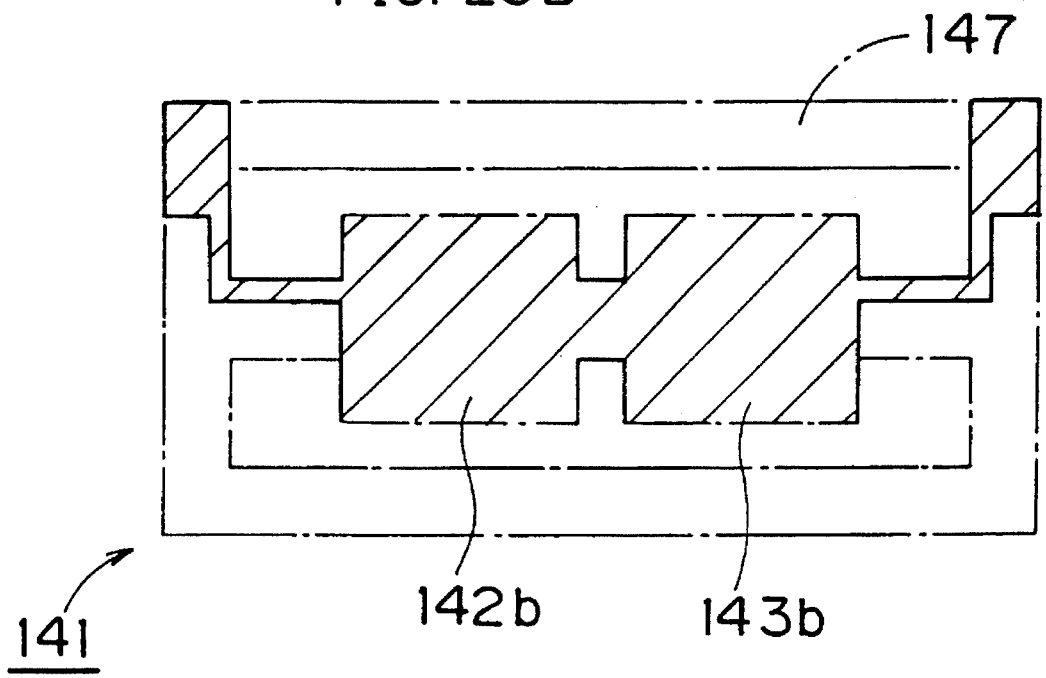

In each of the aforementioned embodiments, a single resonance part utilizing a width expansion mode is formed in the piezoelectric resonator. However, the present invention is also applicable to a piezoelectric resonator which is provided with a plurality of resonance parts utilizing a width expansion mode. Such an embodiment is now described with reference to FIGS. 23A and 23B. FIGS. 23A and 23B are plan view of such a piezoelectric resonator 141 and a typical plan view showing shapes of lower electrodes through a piezoelectric ceramic plate respectively.

The piezoelectric resonator 141, which is adapted to form a double-mode piezoelectric filter, has first and second piezoelectric resonance units 142 and 143 utilizing a width expansion vibration mode. The piezoelectric resonance units 142 and 143 are formed by rectangular piezoelectric ceramic plate parts which are uniformly polarized along thicknesses thereof, electrodes 142a and 143a which are provided on single major surfaces of the rectangular piezoelectric ceramic plate parts for forming resonance electrodes, and electrodes 142b and 143b which are provided on lower surfaces thereof for serving as earth electrodes.

The first and second piezoelectric resonance units 142 and 143 are excited in a width expansion vibration mode respectively, and nodal points of the vibration are coupled with each other by a coupling member 144. In the lower surfaces, on the other hand, the electrodes 142b and 143b are electrically connected with each other by a connecting conductive part which is formed on a lower surface of the coupling member 144. Therefore, it is possible to form a double mode piezoelectric filter utilizing symmetrical and asymmetrical modes by employing the electrode 142a or 143a as an input or output electrode and the lower electrodes 142b and 143b as earth electrodes.

The feature of this embodiment resides in employment of the two piezoelectric resonance units 142 and 143, while other points thereof are similar to those of the piezoelectric resonator 11. Namely, outer sides of the first and second piezoelectric resonance units 142 and 143 are coupled to a rectangular frame type support part 147 through support members respectively. Thus, the first and second piezoelectric resonance units 142 and 143 are arranged in an opening 147a of the rectangular frame type support part 147.

The first and second piezoelectric resonance units 142 and 143 and the like which are arranged in the opening 147a are integrally formed with the support member 147. Namely, a single piezoelectric ceramic plate is machined or etched to obtain an integral member having the plane shape shown in FIGS. 23A and 23B.

Figure 24:
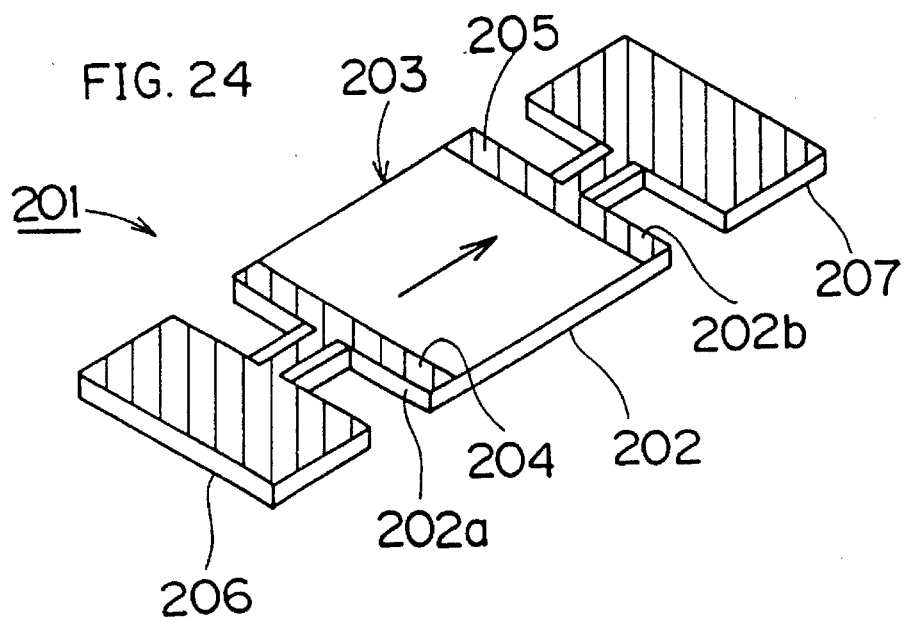
FIG. 24 is a perspective view showing a piezoelectric resonator according to an eighth embodiment of the present invention.

FIG. 24 is a perspective view showing a piezoelectric resonator 201 according to an eighth embodiment of the present invention. The piezoelectric resonator 201 according to this embodiment utilizes a piezoelectric transverse effect, similarly to the piezoelectric resonator 11 shown in FIGS. 10A and 10B. In this piezoelectric resonator 201, however, a piezoelectric resonance part 203 which is formed by a piezoelectric ceramic plate 202 having a rectangular section is different in structure from that in the piezoelectric resonator 11. Namely, the piezoelectric ceramic plate 202 is polarized in parallel with its major surfaces, as shown by arrow P (see FIG. 24). Resonance electrodes 204 and 205 are formed on an upper surface of the piezoelectric ceramic plate 202, along both edges 202a and 202b thereof. Other structure of this embodiment is substantially similar to that of the piezoelectric resonator 11, and hence redundant description is omitted.

As hereinabove described, the piezoelectric ceramic plate 202 is polarized in the direction coupling the resonance electrodes 204 and 205 with each other, whereby a resonator utilizing the width expansion mode excited by a piezoelectric transverse effect is provided upon application of an alternating voltage across the resonance electrodes 204 and 205. Also in this embodiment, the ratio b/a of the length of each longer side to that of each shorter side is selected in relation similar to that of the embodiment shown in FIGS. 10A and 10B. Thus, a piezoelectric resonator utilizing a width expansion mode is provided similarly to the embodiment shown in FIGS. 10A and 10B, and this piezoelectric resonator can be mechanically held by holding parts 206 and 207.

Figure 25:
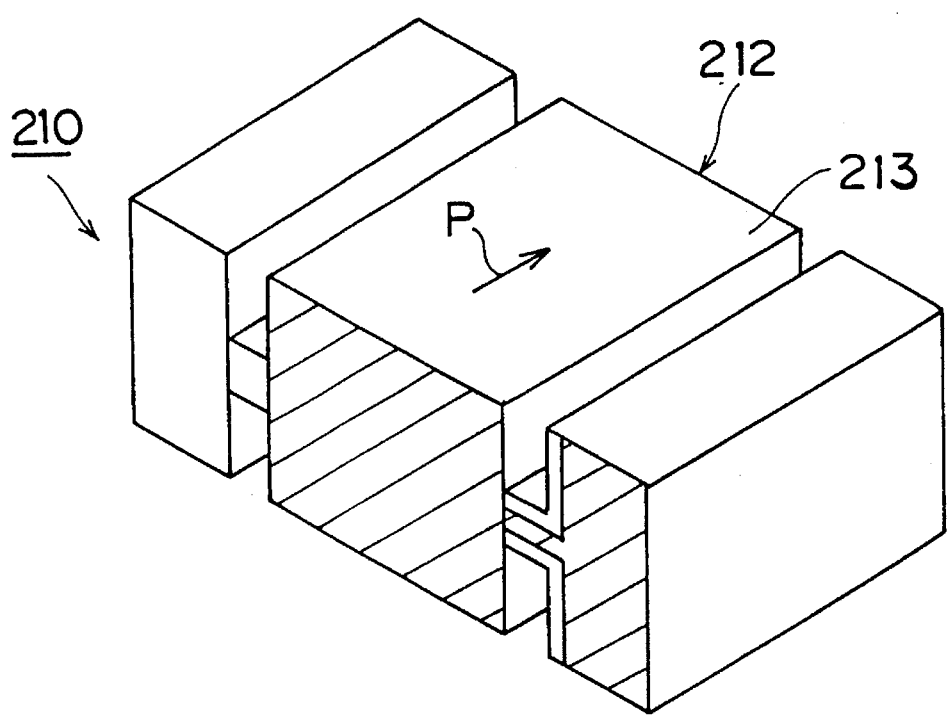
FIG. 25 is a perspective view showing a piezoelectric resonator according to a ninth embodiment of the present invention.

FIG. 25 is a perspective view showing a piezoelectric resonator 210 according to a ninth embodiment of the present invention. The piezoelectric resonator 210 according to this embodiment corresponds to a modification of the piezoelectric resonator 11 shown in FIGS. 10A and 10B. This piezoelectric resonator 210 is different from that shown in FIGS. 10A and 10B in a point that a piezoelectric ceramics member 213 in the form of a rectangular parallelopiped is employed with a thickness which is considerably smaller than that of the piezoelectric ceramic plate 13 employed in the piezoelectric resonator 11 shown in FIGS. 10A and 10B. The piezoelectric ceramics member 213 forming a piezoelectric resonance part 212 has a rectangular sectional shape having a ratio b/a which is selected in a similar manner to that of the embodiment shown in FIGS. 10A and 10B, and a resonance electrode 14 (that provided on the other side is not shown in FIG. 25) is formed on each major surface which is in parallel with the rectangular section. Thus, the vibrator having a rectangular section may be in the form of a rectangular parallelopiped having a thickness which is larger than the length b of its longer side according to the present invention.

Figure 26:
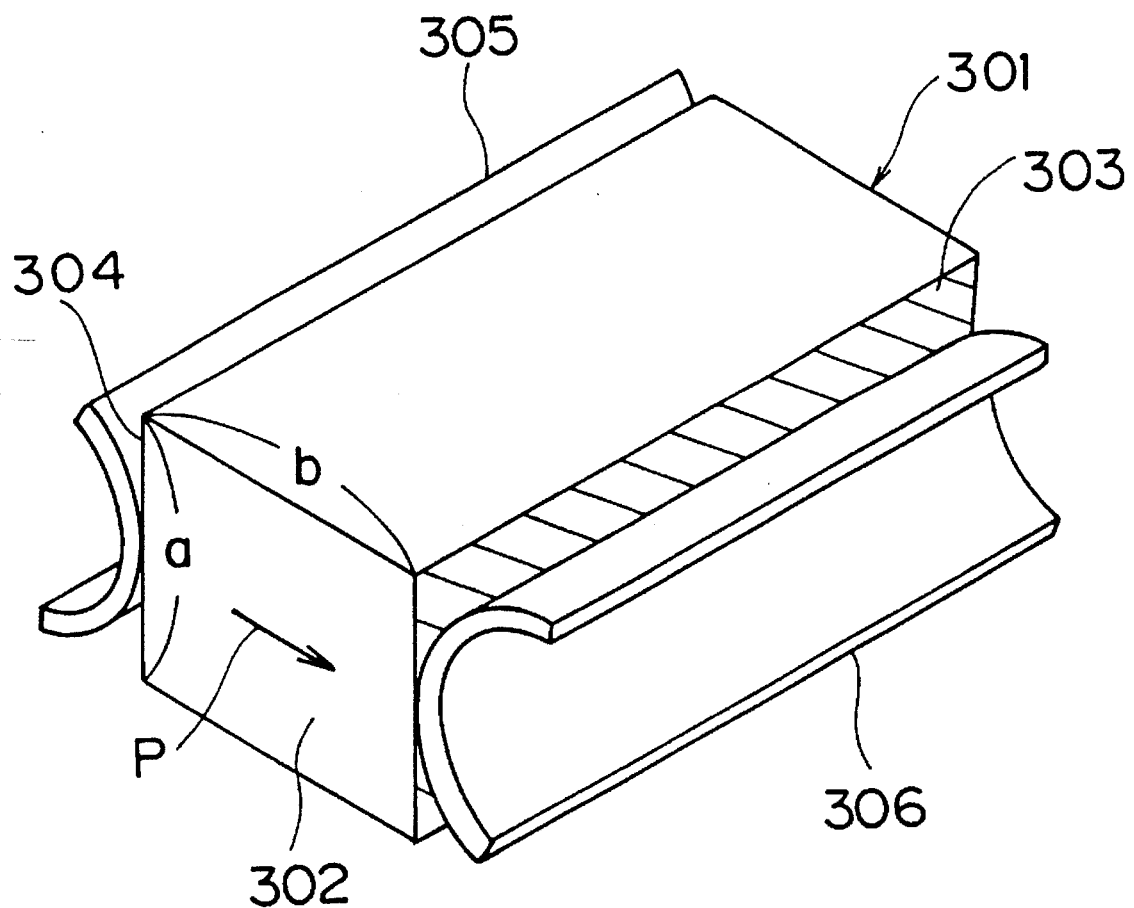
FIG. 26 is a perspective view showing a piezoelectric resonator according to a tenth embodiment of the present invention, which is held by spring terminals.

FIG. 26 is a perspective view showing a vibrator 301 according to a tenth embodiment of the present invention, which is held by spring terminals 305 and 306. The vibrator 301 according to this embodiment is formed by a piezoelectric ceramics member 302 in the form of a rectangular parallelopiped, which has a rectangular section with longer sides each having a length b and shorter sides each having a length a. This piezoelectric ceramics member 302 is polarized along arrow P, i.e., in parallel with the longer sides. Resonance electrodes 303 and 304 are formed on a pair of opposite side surfaces of the piezoelectric ceramics member 302 respectively. These side surfaces are located on the shorter sides.

When an alternating voltage is applied across the resonance electrodes 303 and 304, the vibrator 301 resonates in a width expansion mode and nodal portions of the vibration linearly appear on the side surfaces which are located on the shorter sides. In other words, the nodal portions of vibration appear in linear regions extending along the thickness of the piezoelectric ceramics member 302, i.e., perpendicularly to the rectangular section, in positions half the vertical positions of the resonance electrodes 303 and 304. Thus, it is possible to easily hold the vibrator 301 mechanically in the aforementioned linear nodal portions with the spring terminals 305 and 306, as shown in FIG. 26.

As clearly understood from the vibrator 301 shown in FIG. 26, it is also possible to hold the inventive vibrator with spring terminals, dissimilarly to the aforementioned embodiments. Also in this case, no severe stress concentration is caused between the vibrator 301 and the spring terminals 305 and 306 since the nodal portions of vibration linearly appear along the thickness of the piezoelectric ceramics member 302 according to this embodiment, and hence the vibrator 301 is hardly cracked.

While the material for the vibrator is prepared from piezoelectric ceramics in each of the aforementioned embodiments, the piezoelectric ceramics may be replaced by any material showing the piezoelectric characteristics such as a piezoelectric single crystal of quartz crystal, $LiTaO_3$ or $LiNbO_3$ or a polymer showing the piezoelectricity. Further, the piezoelectric plate may be constituted by even a semiconductor plate or a metal plate not showing the piezoelectricity per se on which a piezoelectric material layer is formed.

While the double mode piezoelectric filter is shown in FIG. 23, the present invention may be applied to a single mode piezoelectric filter.

Although the present invention has been described and illustrated in detail, it is clearly understood that the same is by way of illustration and example only and is not to be taken by way of limitation, the spirit and scope of the present invention being limited only by the terms of the appended claims.

Further, although the embodiments described above utilize the basic wave of the width expansion mode, the same meritorious effects can be obtained in case of using the odd number harmonic waves such as third harmonic wave, fifth harmonic wave or the like and thus such harmonic wave may be used in the embodiments described in the foregoing.

What is claimed is:

1. A vibrator of generally rectangular section for vibrating in a width-expansion vibration mode, the vibrator comprising:

a pair of shorter sides and a pair of longer sides, a ratio b/a of a length of each said longer side to a length of each said shorter side being within a range of ±10% of the value:

$$n(-1.47\sigma+1.88) \qquad (1)$$

where a represents the length of each said shorter side, b represents the length of each said longer side, $\sigma$ represents the Poisson's ratio of a material forming said vibrator, and n represents an integer, wherein when an electric charge is applied thereto a width-expansion vibration is generated in the vibrator with nodal points of vibration at respective central points of the shorter sides of the vibrator.

2. A vibrator in accordance with claim 1, wherein said vibrator has a thickness extending in a direction perpendicular to said rectangular section formed by said pair of shorter sides and said pair of longer sides, said thickness of said vibrator being greater than the length b of each said longer side.

3. A resonator comprising:

a vibrator for vibrating in a width-expansion vibration mode, the vibrator including a pair of shorter sides and a pair of longer sides, a ratio b/a of a length of each said longer side to a length of each said shorter side being within a range of ±10% of the value of $n(-1.47\sigma+1.88)$, where a represents the length of each said shorter side, b represents the length of each said longer side, $\sigma$ represents the Poisson's ratio of a material forming said vibrator, and n represents an integer, wherein when an electric charge is applied to said vibrator, a width expansion vibration is generated in said vibrator with nodal points of vibration at respective central points of said shorter sides of said vibrator; and a support member coupled to a substantially central portion of at least one of said pair of shorter sides of said vibrator.

4. A resonator in accordance with claim 3, wherein said vibrator of generally rectangular section is a piezoelectric resonance part.

5. A resonator in accordance with claim 3, wherein said piezoelectric resonance part has a piezoelectric ceramic plate, the piezoelectric ceramic plate having a thickness and being polarized along its thickness, and electrodes formed on both major surfaces of said piezoelectric ceramic plate.

6. A resonator in accordance with claim 4, wherein said support member has a first and a second side, the first side being coupled to the substantially central portion of the shorter side of the vibrator, the resonator further comprising a holding part, the holding part being coupled to the second side of said support member opposite to said first side coupled to said vibrator.

7. A resonator in accordance with claim 6, further comprising a terminal electrode formed on said holding part, said terminal electrode being electrically connected to an electrode formed on said piezoelectric ceramic plate.

8. A resonator in accordance with claim 3, wherein said support member is coupled to a substantially central portion of each side surface of said vibrator on each said shorter side.

9. A resonator in accordance with claim 3, wherein said piezoelectric resonance part comprises a piezoelectric ceramic plate, the piezoelectric ceramic plate having a thickness and being polarized in a direction perpendicular to its thickness, and first and second electrodes arranged on one major surface of said piezoelectric ceramic plate at a prescribed distance.

10. A resonator in accordance with claim 8, wherein said support member has a first and a second side, the first side being coupled to the substantially central portion of the shorter side of the vibrator, the resonator further comprising a holding part, the holding part being coupled to the second side of said support member opposite to said first side coupled to said vibrator.

11. A resonator in accordance with claim 10, further comprising a terminal electrode formed on said holding part, said terminal electrode being electrically connected to an electrode formed on said piezoelectric ceramic plate.

12. A resonator in accordance with claim 10, wherein said support member is coupled to a substantially central portion of each side surface of said vibrator on each said shorter side.

13. A resonator in accordance with claim 3, wherein said support member and a holding part are arranged on each side of said vibrator.

14. A resonator in accordance with claim 13, further comprising first and second spacers bonded to said pair of holding parts, respectively, for forming rectangular storage spaces enclosing said vibrator.

15. A resonator in accordance with claim 14, wherein said first and second spacers and said pair of holding parts are formed by a single member, whereby said vibrator is arranged in an opening of a rectangular frame type support part having said opening.

16. A resonator in accordance with claim 15, further comprising:

first and second protective substrates stacked on upper and lower portions of an integrated structure of said resonator and said spacers, and cavity forming means provided between said holding parts or said protective substrates and said resonator for ensuring spaces for allowing vibration of a vibrating portion of said resonator.

17. A resonator in accordance with claim 16, wherein said cavity forming means is a rectangular frame type member.

18. A resonator in accordance with claim 16, being formed as a chip-type component.

19. A resonator in accordance with claim 3, wherein said vibrator has a thickness extending in a direction perpendicular to said rectangular section formed by said pair of shorter sides and said pair of longer sides, said thickness of said vibrator being greater than the length b of each said longer side.

20. A resonator in accordance with claim 6, wherein said support member is coupled to a substantially central portion of each side surface of said vibrator on each said shorter side.

* * * * *